United States Patent
Matsuda

(10) Patent No.: US 9,252,352 B2
(45) Date of Patent: Feb. 2, 2016

(54) ULTRASONIC TRANSDUCER DEVICE, HEAD UNIT, PROBE, AND ULTRASONIC IMAGING APPARATUS

(71) Applicant: SEIKO EPSON CORPORATION, Tokyo (JP)

(72) Inventor: Hiroshi Matsuda, Gifu (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/191,998

(22) Filed: Feb. 27, 2014

(65) Prior Publication Data

US 2014/0241113 A1    Aug. 28, 2014

(30) Foreign Application Priority Data

Feb. 28, 2013    (JP) ................................. 2013-038459

(51) Int. Cl.
*H01L 41/00* (2013.01)
*H01L 41/047* (2006.01)
(Continued)

(52) U.S. Cl.
CPC .......... *H01L 41/0475* (2013.01); *B06B 1/0622* (2013.01); *G01S 7/56* (2013.01); *G01S 15/02* (2013.01)

(58) Field of Classification Search
CPC ........ H04B 11/00; B06B 1/06; B06B 1/0644; B06B 1/0688; B06B 1/0207; H01L 41/09; H01L 41/0475; G01S 7/56
USPC ........................................................ 367/135
See application file for complete search history.

(56) References Cited

U.S. PATENT DOCUMENTS 4,412,316 A * 10/1983 Diepers ......................... 367/105
H0001491 H    9/1995 Ivey et al.
(Continued)

FOREIGN PATENT DOCUMENTS

JP    63-193380 U    12/1988
JP    05-291227 A    11/1993
(Continued)

OTHER PUBLICATIONS

Kanda et al.; Influence of Parasitic Capacitance on Output Voltage of Series-Connected PZT Elements; PowerMEMS 2009, Washington DC, USA, Dec. 1-4, 2009; pp. 597-600.

*Primary Examiner* — Isam Alsomiri
*Assistant Examiner* — Hovhannes Baghdasaryan
(74) *Attorney, Agent, or Firm* — Global IP Counselors, LLP

(57) ABSTRACT

An ultrasonic transducer device includes an ultrasonic transducer element array, a first signal terminal and a second signal terminal. The ultrasonic transducer element array has a $1^{st}$ element group to a $k^{th}$ element group (where k is a natural number such that k≥2). The first signal terminal is connected with a control section configured to perform at least one of receiving and transmitting of signals. The second signal terminal is connected with the first signal terminal via the ultrasonic transducer element array. Each of the $1^{st}$ element group to the $k^{th}$ element group includes a plurality of ultrasonic transducer elements electrically connected in parallel. The $1^{st}$ element group to the $k^{th}$ element group are electrically connected in series between the first signal terminal and the second signal terminal.

16 Claims, 15 Drawing Sheets

(51) Int. Cl.
  *G01S 7/56* (2006.01)
  *G01S 15/02* (2006.01)
  *B06B 1/06* (2006.01)

(56) References Cited

U.S. PATENT DOCUMENTS

| | | | |
|---|---|---|---|
| 5,864,262 A * | 1/1999 | Ikada | 333/193 |
| 6,344,705 B1 * | 2/2002 | Solal et al. | 310/313 B |
| 6,407,484 B1 * | 6/2002 | Oliver et al. | 310/339 |
| 7,173,504 B2 | 2/2007 | Larson, III et al. | |
| 2004/0130411 A1 * | 7/2004 | Beaudin et al. | 333/133 |
| 2005/0165314 A1 * | 7/2005 | Tanaka | 600/459 |
| 2007/0252748 A1 * | 11/2007 | Rees et al. | 342/29 |
| 2007/0290578 A1 * | 12/2007 | Horie | 310/344 |
| 2008/0002375 A1 * | 1/2008 | Nozaki et al. | 361/749 |
| 2008/0027323 A1 * | 1/2008 | Freiburger | 600/453 |
| 2008/0172051 A1 * | 7/2008 | Masuda et al. | 606/37 |
| 2009/0230822 A1 * | 9/2009 | Kushculey et al. | 310/366 |
| 2009/0240151 A1 * | 9/2009 | Sabata | 600/447 |
| 2009/0318808 A1 * | 12/2009 | Brader | 600/443 |
| 2010/0189288 A1 * | 7/2010 | Menzel et al. | 381/151 |
| 2010/0292632 A1 * | 11/2010 | Mulvihill et al. | 604/22 |
| 2011/0127881 A1 * | 6/2011 | Howarth | 310/319 |
| 2011/0237974 A1 * | 9/2011 | Bartol et al. | 600/554 |
| 2012/0123263 A1 * | 5/2012 | Osaka et al. | 600/438 |
| 2012/0188849 A1 | 7/2012 | Matsuda et al. | |

FOREIGN PATENT DOCUMENTS

| | | |
|---|---|---|
| JP | 2004-281651 A | 10/2004 |
| JP | 2007-510374 A | 4/2007 |
| JP | 2010-249658 A | 11/2010 |
| JP | 2011-254295 A | 2/2011 |
| JP | 2011-050571 A | 3/2011 |
| JP | 2011-137768 A | 7/2011 |
| JP | 2012-152319 A | 8/2012 |

* cited by examiner

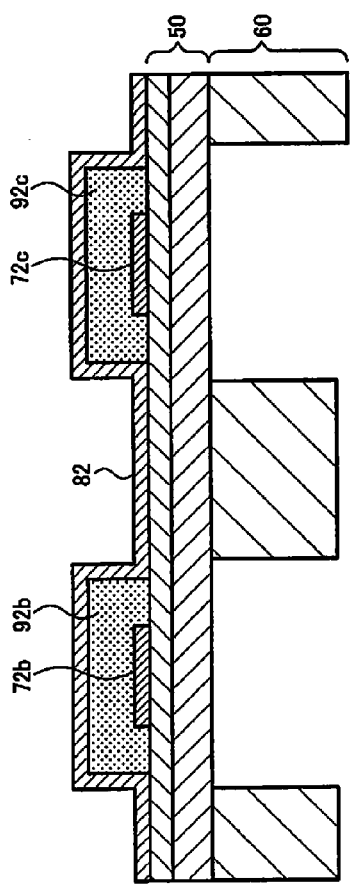
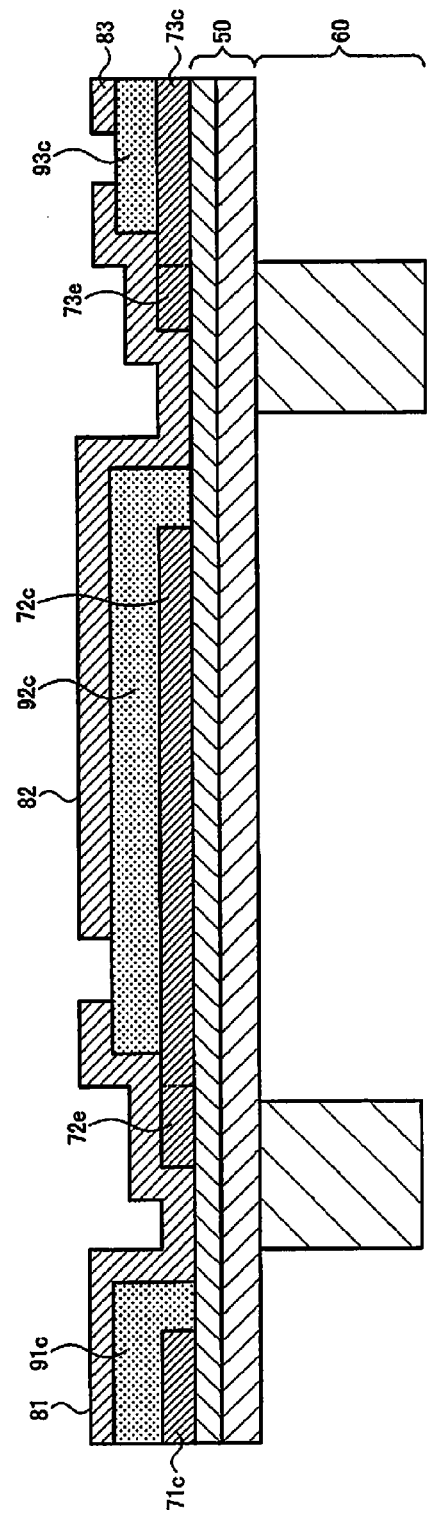
Fig. 5A
Fig. 5B

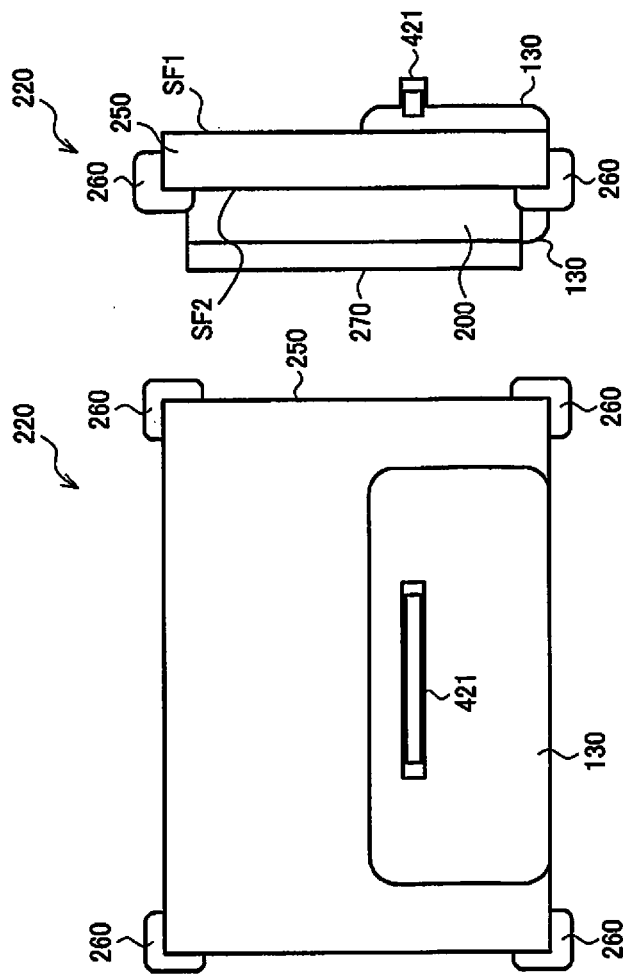
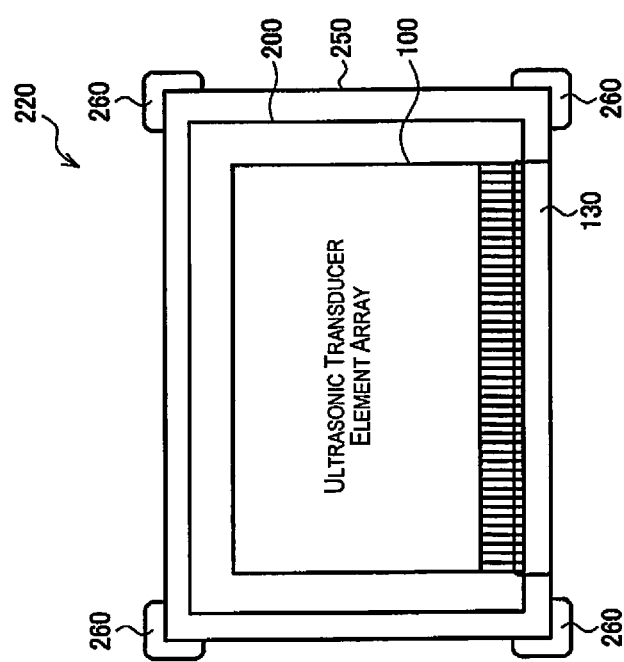

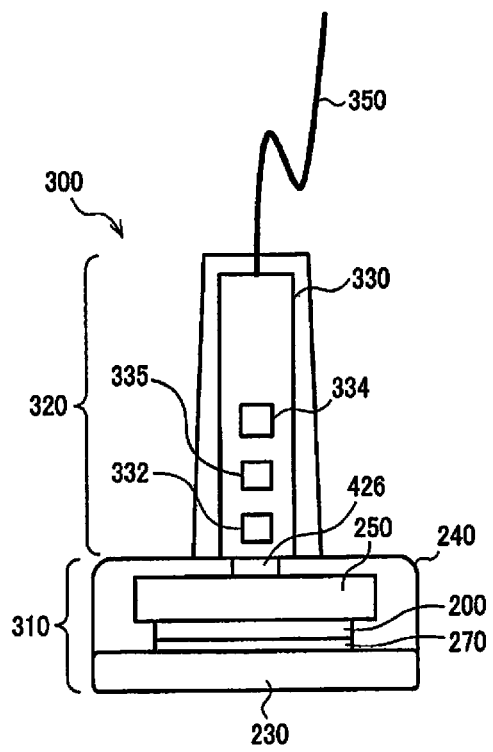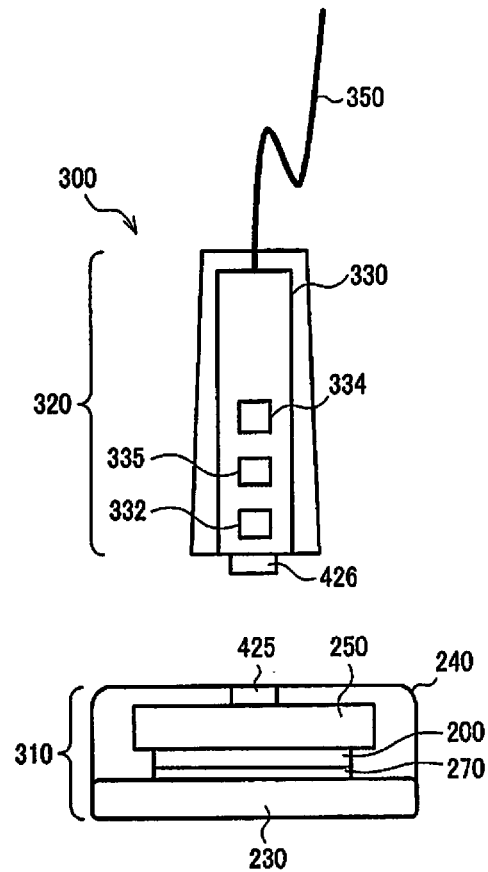
Fig. 14A
Fig. 14B

ULTRASONIC TRANSDUCER DEVICE, HEAD UNIT, PROBE, AND ULTRASONIC IMAGING APPARATUS

CROSS-REFERENCE TO RELATED APPLICATIONS

This application claims priority to Japanese Patent Application No. 2013-038459 filed on Feb. 28, 2013. The entire disclosure of Japanese Patent Application No. 2013-038459 is hereby incorporated herein by reference.

BACKGROUND

1. Technical Field

The present invention relates to an ultrasonic transducer device, a head unit, a probe, an ultrasonic imaging apparatus, and the like.

2. Related Art

An ultrasonic imaging apparatus is known which emits ultrasonic waves from a front end of a probe toward a target object and detects ultrasonic waves which are reflected from the target object (for example, Japanese Unexamined Patent Application Publication No. 2011-50571). For example, the ultrasonic imaging apparatus is used as an ultrasonic diagnosis apparatus which is used in diagnosis by imaging inside the body of a patient or the like. For example, a piezoelectric element is used as an ultrasonic transducer element which transmits and receives ultrasonic waves.

SUMMARY

In an ultrasonic probe in Japanese Unexamined Patent Application Publication No. 2011-50571, in the transmitting and receiving of ultrasonic waves which are used in an ultrasonic transducer array where the ultrasonic transducer elements are lined up, the sensitivity of transmitting and receiving is improved by switching the connection relationship of the ultrasonic transducer elements between connecting in series or in parallel using a switching circuit when transmitting and when receiving. However, there is a problem in that the switching circuit for switching and the wiring for this is complex.

According to several aspects of the present invention, it is possible to provide an ultrasonic transducer device, a head unit, a probe, an ultrasonic imaging apparatus, and the like which are able to improve the sensitivity of transmitting and receiving without using a switching switch.

An ultrasonic transducer device according to one aspect includes an ultrasonic transducer element array, a first signal terminal and a second signal terminal. The ultrasonic transducer element array has a $1^{st}$ element group to a $k^{th}$ element group (where k is a natural number such that k≥2). The first signal terminal is connected with a control section configured to perform at least one of receiving and transmitting of signals. The second signal terminal is connected with the first signal terminal via the ultrasonic transducer element array. Each of the $1^{st}$ element group to the $k^{th}$ element group includes a plurality of ultrasonic transducer elements electrically connected in parallel. The $1^{st}$ element group to the $k^{th}$ element group are electrically connected in series between the first signal terminal and the second signal terminal.

According to the aspect of the present invention, the $1^{st}$ element group to the $k^{th}$ element group are connected in series between the first signal terminal and the second signal terminal and the plurality of ultrasonic transducer elements in each of the element groups are connected in parallel. Due to this, it is possible to improve the sensitivity of transmitting and receiving ultrasonic waves without using a switching switch.

In addition, in another aspect, the first signal terminal is preferably connected with the control section configured to perform receiving and transmitting of signals.

By doing so, it is possible for the control section to perform receiving and transmitting of signals via the first signal terminal and it is possible to perform transmitting and receiving of ultrasonic waves.

In addition, in another aspect, the ultrasonic transducer elements electrically connected in parallel are preferably arranged to line up along a first direction which is a scanning direction.

In addition, in another aspect, the $1^{st}$ element group to the $k^{th}$ element group are preferably arranged to line up along a second direction which intersects with the first direction.

By doing so, since the $1^{st}$ element group to the $k^{th}$ element group are connected in series, it is possible to apply transmission signals with the same phase and the same amplitude to the $1^{st}$ element group to the $k^{th}$ element group which are arranged along the second direction. Due to this, it is possible to suppress natural focus using phase delay or the like, and it is possible to enhance the beam profile in the second direction.

In addition, in another aspect, each of the $1^{st}$ element group to the $k^{th}$ element group preferably has a $1^{st}$ ultrasonic transducer element to a $j^{th}$ ultrasonic transducer element (where j is a natural number such that k≥2) as the ultrasonic transducer elements, and each $s^{th}$ ultrasonic transducer element (where s is a natural number such that s≤j) among the $1^{st}$ ultrasonic transducer element to the $j^{th}$ ultrasonic transducer element in each of the $1^{st}$ element group to the $k^{th}$ element group is preferably arranged to line up along the second direction.

By doing so, since it is possible to arrange the $s^{th}$ ultrasonic transducer elements in the $1^{st}$ element group to the $k^{th}$ element group along the second direction, it is possible to emit ultrasonic waves with the same phase and the same amplitude from the ultrasonic transducer elements which are arranged along the second direction. Due to this, it is possible to achieve a more ideal profile for the beam profile.

In addition, in another aspect, each of the $1^{st}$ element group to the $k^{th}$ element group preferably has at least four of the ultrasonic transducer elements electrically connected in parallel and arranged in a matrix in two directions of a first direction which is a scanning direction and a second direction which intersects with the first direction.

Even in this case, since it is possible to arrange the $s^{th}$ ultrasonic transducer elements in each of the element groups along the second direction, it is possible to enhance the beam profile in the second direction.

In addition, in another aspect, each of the ultrasonic transducer elements preferably has a first electrode, a second electrode, and a transducer section disposed between the first electrode and the second electrode, the first electrode of each of the ultrasonic transducer elements in the $1^{st}$ element group is preferably connected with the first signal terminal, and the second electrode of each of the ultrasonic transducer elements in the $1^{st}$ element group is preferably connected with the first electrode of each of the ultrasonic transducer elements in a $2^{nd}$ element group.

In addition, in another aspect, the second electrode of each of the ultrasonic transducer elements in a $k-1^{th}$ element group among the $1^{st}$ element group to the $k^{th}$ element group is preferably connected with the first electrode of each of the ultrasonic transducer elements in the $k^{th}$ element group, and the second electrode of each of the ultrasonic transducer elements in the $k^{th}$ element group is preferably connected with the second signal terminal.

By doing so, it is possible for the $1^{st}$ element group to the $k^{th}$ element group to be connected in series between the first signal terminal and the second signal terminal. In addition, there is a possibility that a phase delay will be generated in the transmission signal due to resistance in the wiring which connects the first signal terminal and the first electrode and resistance in the wiring which connects the second signal terminal and the second electrode, but it is possible to suppress the phase delay since the plurality of element groups between the first signal terminal and the second signal terminal are connected in series according to the aspect of the present invention.

In addition, in another aspect, the ultrasonic transducer device preferably further includes: an additional first signal terminal, with the first signal terminal and the additional first signal terminal being arranged at a first end section of the ultrasonic transducer element array with respect to a second direction which intersects with the first direction; and a second signal electrode wiring arranged at least at a second end section of the ultrasonic transducer element array with respect to the second direction and connected with the second signal terminal. The $1^{st}$ element group to the $k^{th}$ element group are preferably electrically connected in series between one of the first signal terminals and the second signal electrode wiring.

In addition, in another aspect, the second signal terminal is preferably arranged at the first end section, and the second signal electrode wiring preferably has a first wiring portion arranged at the second end section with respect to the first direction and a second wiring portion connecting the first wiring portion and the second signal terminal.

According to this aspect, since one end of the $1^{st}$ element groups to the $k^{th}$ element groups which configure each of the channels is the second signal electrode wirings, it is possible to easily connect together the second signal electrode wirings of the plurality of channels. It is possible to perform the input and output of signals from only the one end section by connecting together the second signal electrode wirings to the second signal terminal using the first wiring and the second wiring and arranging the second signal terminal and the plurality of first signal terminals at the one end section of the ultrasonic transducer element array.

In addition, an ultrasonic transducer device according to another aspect includes an ultrasonic transducer element array, a first signal terminal, and a second signal terminal. The first signal terminal is connected with a control section configured to perform at least one of receiving and transmitting of signals. The second signal terminal is connected with the first signal terminal via the ultrasonic transducer element array. The ultrasonic transducer element array has one of: a plurality of ultrasonic transducer elements electrically connected in series between the first signal terminal and the second signal terminal; and a plurality of element groups electrically connected in series between the first signal terminal and the second signal terminal, with each of the element groups having a plurality of ultrasonic transducer elements electrically connected in parallel. The plurality of ultrasonic transducer elements or the plurality of element groups are arranged to line up along a second direction intersecting with a first direction which is a scanning direction.

In addition, an ultrasonic transducer device according to another aspect includes a first element group, a second element group and a connecting wiring. The first element group includes a plurality of ultrasonic transducer elements electrically connected in parallel. The second element group includes a plurality of ultrasonic transducer elements electrically connected in parallel. The connecting wiring electrically connects the first element group and the second element group in series.

In addition, a head unit of a probe according to another aspect includes the ultrasonic transducer device according to any one of the above described aspects. The ultrasonic transducer device is configured and arranged to be attached and detached with respect to a probe body of the probe.

In addition, a probe according to another aspect includes the ultrasonic transducer device according to any one of the above described aspects, and a probe body.

In addition, in another aspect, the probe preferably further includes a flexible substrate having first signal wiring connected with the first signal terminal and a second signal wiring connected with the second terminal. The first signal terminal and the second signal terminal are preferably arranged at one end of the ultrasonic transducer device. The flexible substrate is preferably provided at the one end of the ultrasonic transducer device.

In addition, in another aspect, an ultrasonic imaging apparatus includes the probe according to any one of the above described aspects, and a display section configured and arranged to display image data.

BRIEF DESCRIPTION OF THE DRAWINGS

Referring now to the attached drawings which form a part of this original disclosure:

FIGS. 5A and 5B are cross sectional diagrams of the first layout configuration example of the channel element group.

FIGS. 13A to 13C are detailed configuration examples of a head unit.

FIGS. 14A and 14B are configuration examples of an ultrasonic probe.

DETAILED DESCRIPTION OF EXEMPLARY EMBODIMENTS

The following describes a preferred embodiment of the present invention in detail. Here, the present embodiment described below is not gratuitously limited by the content of the present invention described in the scope of the claims and the entire configuration described in the present embodiment is not necessarily essential as a means to solve the problems in the present invention.

1. Ultrasonic Transducer Element

Figure 1A:
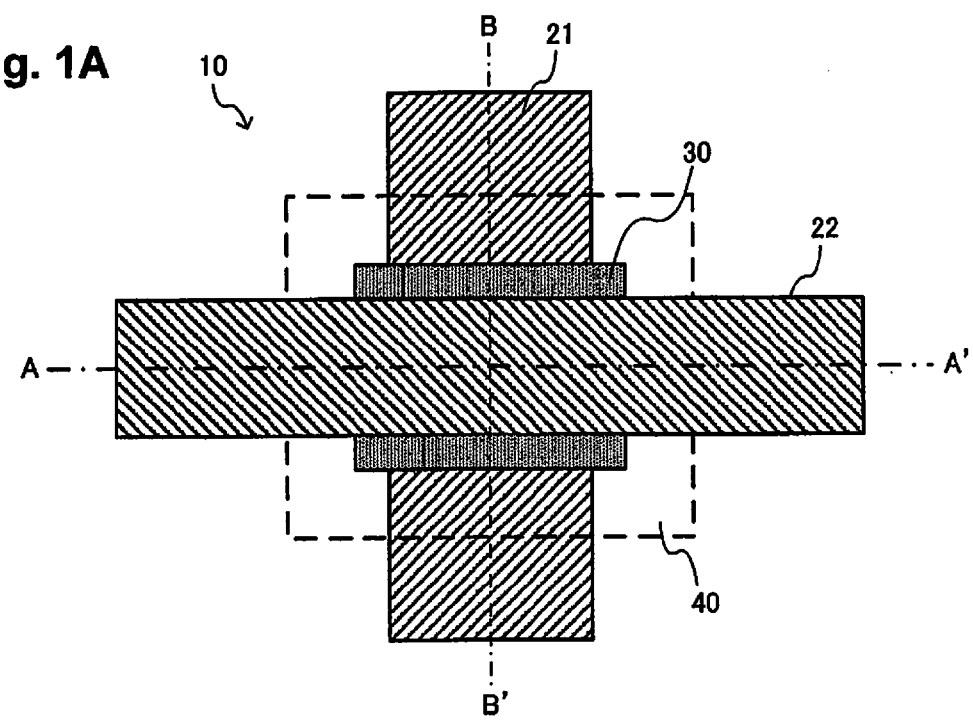
FIGS. 1A to 1C are configuration examples of an ultrasonic transducer element.
Figure 1B:
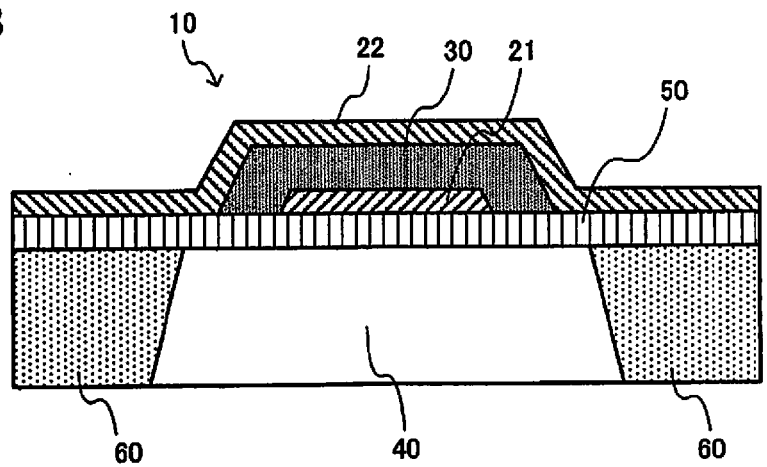
Figure 1C:
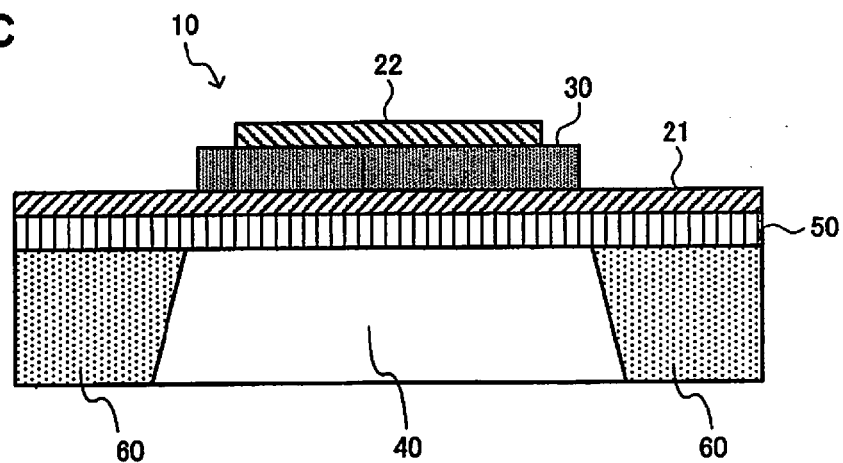

FIGS. 1A to 1C illustrate a configuration example of an ultrasonic transducer element 10 which is applied to an ultrasonic transducer device of the present embodiment. The ultrasonic transducer element 10 includes a vibrating film 50 (a membrane and a support member), a first electrode layer 21 (a lower electrode layer), a piezoelectric body layer 30 (a piezoelectric body film), and a second electrode layer 22 (an upper electrode layer).

The ultrasonic transducer element 10 is formed on a substrate 60. The substrate 60 is, for example, a silicon substrate. FIG. 1A is a planar diagram of the ultrasonic transducer element 10 viewed from a direction which is orthogonal to the substrate 60 on an element forming surface side. FIG. 1B is a cross sectional diagram illustrating a cross section along AA' in FIG. 1A. FIG. 1C is a cross sectional diagram illustrating a cross section along BB' in FIG. 1A.

The first electrode layer 21 is formed by, for example, a metal thin film on an upper layer of the vibrating film 50. The first electrode layer 21 may be wiring which extends to an outer side of an element forming region as shown in FIG. 1A and is connected with the adjacent ultrasonic transducer element 10.

The piezoelectric body layer 30 is formed using, for example, a PZT (lead zirconate titanate) thin film and is provided so as to cover at least a portion of the first electrode layer 21. Here, the material of the piezoelectric body layer 30 is not limited to PZT, and for example, lead titanate ($PbTiO_3$), lead zirconate ($PbZrO_3$), lanthanum-modified lead titanate ($(Pb, La)TiO_3$), and the like may be used.

The second electrode layer 22 is formed using, for example, a thin metal film and is provided so as to cover at least a portion of the piezoelectric body layer 30. The second electrode layer 22 may be wiring which extends to an outer side of the element forming region as shown in FIG. 1A and is connected with the adjacent ultrasonic transducer element 10.

One out of a portion which is covered by the piezoelectric body layer 30 out of the first electrode layer 21 and a portion which covers the piezoelectric body layer 30 out of the second electrode layer 22 forms the first electrode and the other portion of the first electrode layer 21 and the second electrode layer 22 forms the second electrode. The piezoelectric body layer 30 is provided to interpose the first electrode and the second electrode. The first electrode, the second electrode, and the piezoelectric body layer 30 are referred to as the piezoelectric element section.

The vibrating film 50 is provided so as to block off an opening 40 using a two layer structure of, for example, an $SiO_2$ thin film and a $ZrO_2$ thin film. It is possible for the vibrating film 50 to support the piezoelectric body layer 30, the first electrode layer 21, and the second electrode layer 22, to vibrate according to expansions and contractions of the piezoelectric body layer 30, and to generate ultrasonic waves.

The opening 40 (a hollow region) is formed by etching using reactive ion etching (RIE) or the like from the rear surface (the surface where elements are not formed) side of the substrate 60. The resonance frequency of the ultrasonic waves is determined by the size of the vibrating film 50 which is able to vibrate according to the forming of the opening 40 and the ultrasonic waves are radiated to the piezoelectric body layer 30 side (in a forward direction from behind the surface of the diagram in FIG. 1A).

The piezoelectric body layer body 30 expands and contracts in an in-plane direction by a voltage being applied between the first electrode and the second electrode, that is, between the first electrode layer 21 and the second electrode layer 22. The ultrasonic transducer element 10 uses a monomorphic (unimorphic) structure where a thin piezoelectric element (the piezoelectric body layer 30) and a metal plate (the vibrating film 50) are bonded, and warping is generated in order to maintain the dimensions of the vibrating film 50 which is bonded to the piezoelectric body layer 30 when the piezoelectric body layer 30 expands and contracts in the in-plane. The vibrating film 50 vibrates with respect to a film thickness direction due to an alternating current being applied to the piezoelectric body layer 30, and ultrasonic waves are radiated due to the vibration of the vibrating film 50. The voltage which is applied to the piezoelectric body layer 30 is, for example, 10 to 30 V and the frequency is, for example, 1 to 10 MHz.

It is possible to narrow the element pitch since it is possible to reduce the size of the elements compared to the bulk ultrasonic transducer elements due to the ultrasonic transducer elements 10 being configured as described above. Due to this, it is possible to suppress the generation of grating lobes. In addition, it is possible to configure a driving circuit using a circuit element with low resistance to voltage since driving is possible using voltage amplitude which is small compared to bulk ultrasonic transducer elements.

2. Ultrasonic Transducer Device

Figure 2:
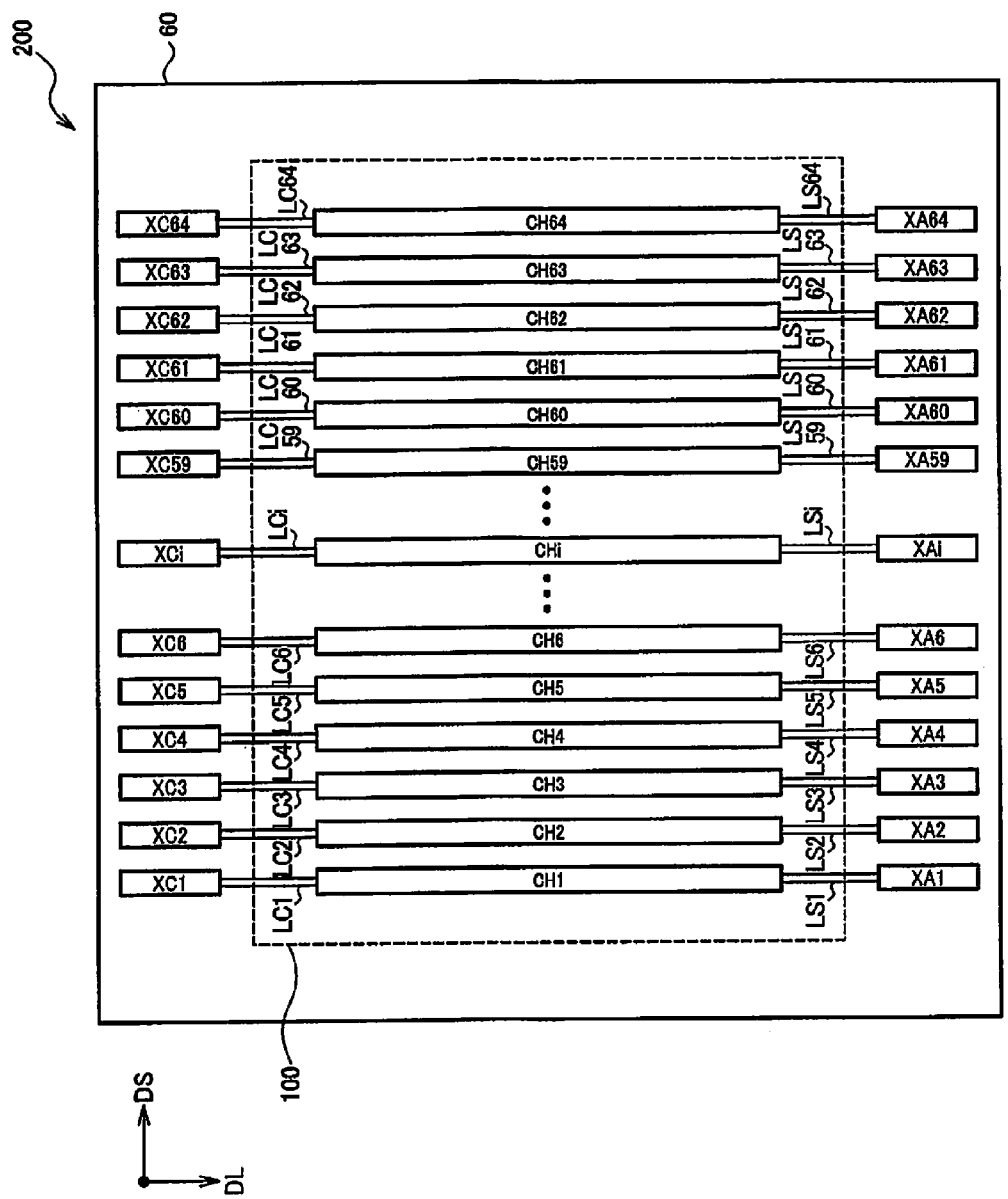
FIG. 2 is a configuration example of an ultrasonic transducer device.

FIG. 2 illustrates a configuration example of an ultrasonic transducer device 200 of the present embodiment. It is possible to adopt a transducer which is a type which uses a piezoelectric element as described above (a thin film piezoelectric element) as the ultrasonic transducer device 200, but the present embodiment is not limited to this. For example, a transducer which is a type which uses a capacitive element such as a c-MUT (Capacitive Micro-machined Ultrasonic Transducer) may be adopted.

Here, below, a case where the transmitting and receiving channels are configured as $1^{st}$ to $64^{th}$ channels will be described as an example, but the present embodiment is not limited to this and the transmitting and receiving channels may be configured as $1^{st}$ to $n^{th}$ channels where n does not equal 64. In addition, below, a case where the element groups are connected between the signal terminals and the common terminal will be described as an example, but the present embodiment is not limited to this. That is, the element groups may be connected between two signal terminals and, for example, an opposite phase signal may be supplied to the two signal terminals.

The ultrasonic transducer device 200 includes the substrate 60, an ultrasonic transducer element array 100 which is formed on the substrate 60, signal terminals XA1 to XA64 which are formed on the substrate 60, common terminals XC1 to XC64 (signal terminals in a broad meaning) which are formed on the substrate 60, signal electrode wirings LS1 to LS64 which are formed on the substrate 60, and common electrode wirings LC1 to LC64 (signal electrode wirings in a broad meaning) which are formed on the substrate 60.

The signal terminals XA1 to XA64 are arranged at one end section of the ultrasonic transducer element array 100 in a slice direction DL and each of the signal terminals XAi (i is a natural number such that i≤n=64) is connected with one end of the signal electrode wirings LSi. The common terminals XC1 to XC64 are arranged at the other end section of the ultrasonic transducer element array 100 in the slice direction DL and each of the common terminals XCi is connected with one end of the common electrode wirings LCi. For example, the substrate 60 has a rectangular shape with a scanning direction DS as the long side direction, the signal terminals XA1 to XA64 are arranged along one long side of the rectangular shape, and the common terminals XC1 to XC64 are arranged along the other long side of the rectangular shape.

Here, the scanning direction DS and the slice direction DL represent directions on the plane of the substrate 60. The scanning direction DS corresponds to, for example, the direction where an ultrasonic beam scans in scanning operations such as sector scanning or linear scanning. The slice direction DL is a direction which intersects with (for example, is orthogonal to) the scanning direction DS and, for example, in a case where a tomographic image is obtained by scanning an ultrasonic beam, corresponds to the direction which is orthogonal to the tomography.

The ultrasonic transducer element array 100 includes channel element groups CH1 to CH64 which are arranged along the scanning direction DS. Each channel element group CHi is configured by a plurality of ultrasonic transducer elements 10 which are electrically connected and is connected with the other end of the signal electrode wirings LSi and the other end of the common electrode wirings LCi. A detailed configuration of the channel element group CHi will be described later.

One transmitting and receiving channel is configured by the signal terminal XAi, the signal electrode wiring LSi, the channel element group CHi, the common electrode wiring LCi, and the common terminal XCi. That is, when a transmission signal (for example, a voltage pulse) is supplied to the signal terminal XAi, the transmission signal is converted into ultrasonic waves by the ultrasonic transducer element 10 of the channel element group CHi and emitted as ultrasonic waves. Then, an ultrasonic echo which is reflected by the target object is converted into a reception signal (for example, a voltage signal) by the ultrasonic transducer element 10 and the reception signal is output from the signal terminal XAi. Here, a common voltage (for example, a constant voltage) is supplied to the common terminal XCi.

3. Channel Element Groups

Here, in order to detect the ultrasonic echo with high sensitivity, it is necessary to perform at least one of increasing transmission sound pressure and improving reception sensitivity.

As a method for increasing the transmission sound pressure, connecting a plurality of the ultrasonic transducer elements 10 in parallel between the signal terminal XAi and the common terminal XCi may be considered. In the case of connecting in parallel, since the transmission voltage between the terminals XAi and XCi is applied to the plurality of ultrasonic transducer elements 10, it is possible to increase the transmission sound pressure compared to the case where there is one of the ultrasonic transducer elements 10.

However, in the case of connecting in parallel, since there is output to the terminals XAi and XCi without increasing the amplitude of the reception voltage of each of the ultrasonic transducer elements 10, it is not possible to expect an improvement in reception sensitivity. For example, it is necessary to receive weak echoes in order to observe the depth of a body and it is necessary to increase S/N during reception. In addition, since there is an upper limit to the transmission sound pressure in consideration of the effects or the like on the human body, it is necessary to increase reception sensitivity.

As a method for improving reception sensitivity, connecting the plurality of ultrasonic transducer elements 10 in series between the signal terminal XAi and the common terminal XCi may be considered. In the case of connecting in series, since there is output to the terminals XAi and XCi by increasing the reception voltage between the terminals of each of the ultrasonic transducer elements 10, it is possible to improve reception sensitivity.

However, since the transmission voltage is subject to voltage division and applied to the plurality of ultrasonic transducer elements 10, it is not possible to expect an improvement in transmission sound pressure. In this manner, there is a problem in that it is difficult to improve the sensitivity of transmitting and receiving as a whole by increasing both transmission sound pressure and reception sensitivity.

Figure 3:
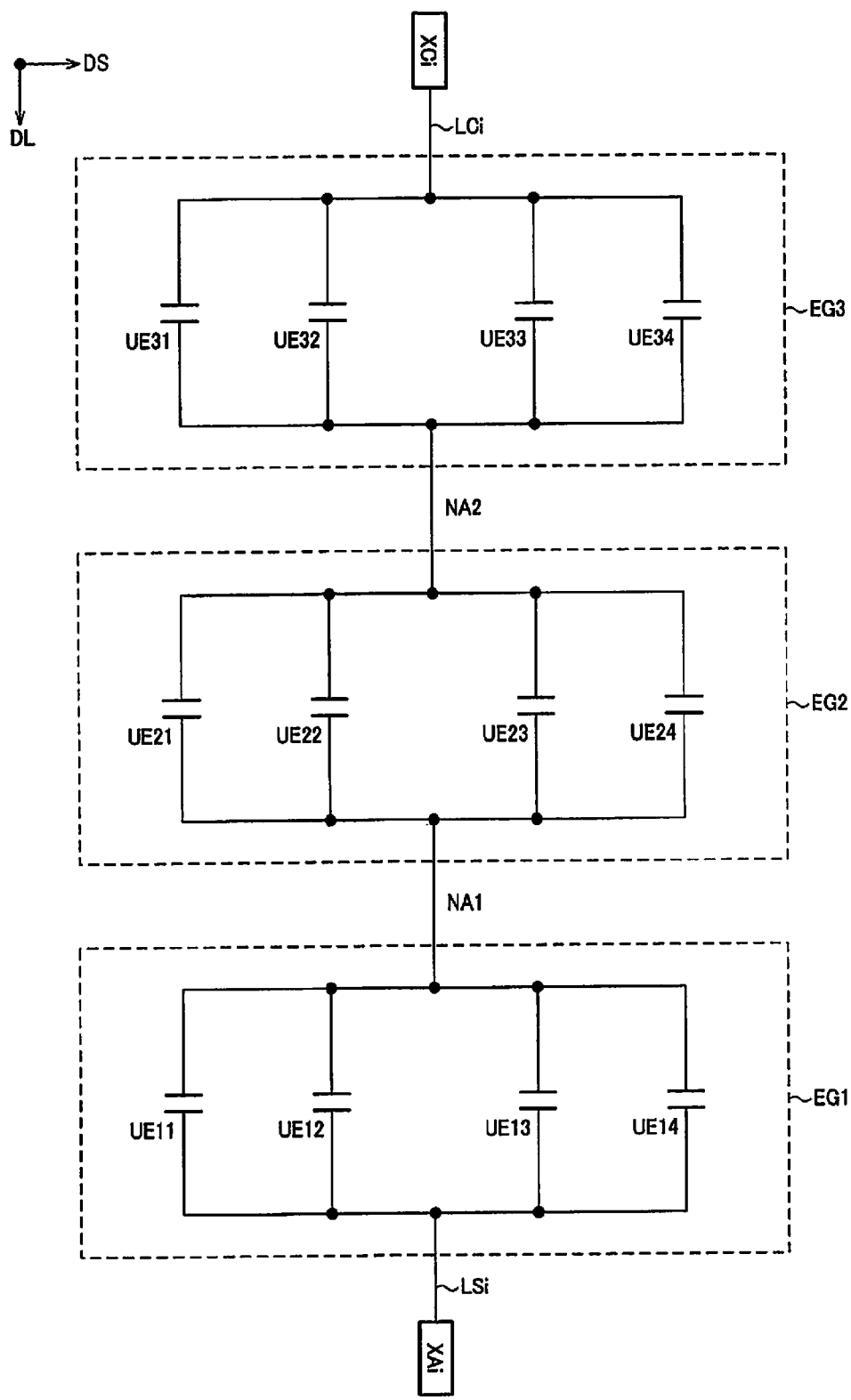
FIG. 3 is a configuration example of a channel element group.

FIG. 3 illustrates a configuration example of the channel element group CHi of the present embodiment which is able to solve the problem described above. The channel element group CHi includes element groups EG1 to EGk (k is a natural number such that k≥2) which are connected in series between the signal electrode wirings LSi and the common electrode wirings LCi. Here, below, a case where k=3 will be described as an example, but the present embodiment is not limited to this.

Each of the element groups of the element groups EG1 to EG3 has j of the ultrasonic transducer elements 10 (j is a natural number such that j≥2) which are connected in parallel. Here, below, a case where j=4 will be described as an example, but the present embodiment is not limited to this. In detail, the element group EG1 has ultrasonic transducer elements UE11 to UE14 which are connected in parallel between the signal electrode wirings LSi and a node NA1, the element group EG2 has ultrasonic transducer elements UE21 to UE24 which are connected in parallel between the node NA1 and a node NA2, and the element group EG3 has ultrasonic transducer elements UE31 to UE34 which are connected in parallel between the node NA2 and the common electrode wiring LCi.

The ultrasonic transducer elements UE11 to UE14, UE21 to UE24, and UE31 to UE34 of each of the element groups are arranged along the scanning direction DS and the element groups EG1 to EG3 are arranged along the slice direction DL. In detail, ultrasonic transducer elements UE1s, UE2s, and UE3s (s is a natural number such that s≤3=j) are arranged along the slice direction DL.

Here, in the present embodiment, the ultrasonic transducer elements UE1s, UE2s, and UE3s are not limited to a case of being lined up in a straight line along the slice direction DL, and for example, the ultrasonic transducer elements UE1s, UE2s, and UE3s may be lined up to be alternately shifted with respect to a straight line (for example, UE1s, and UE3s may be shifted to the right of the paper surface of the diagram and UE2s may be shifted to the left of the paper surface of the diagram). In addition, the number of ultrasonic transducer elements in each of the element groups is not limited to the same number as j and the number of ultrasonic transducer elements may be different for each of the element groups.

4. Layout Configuration

Figure 4:
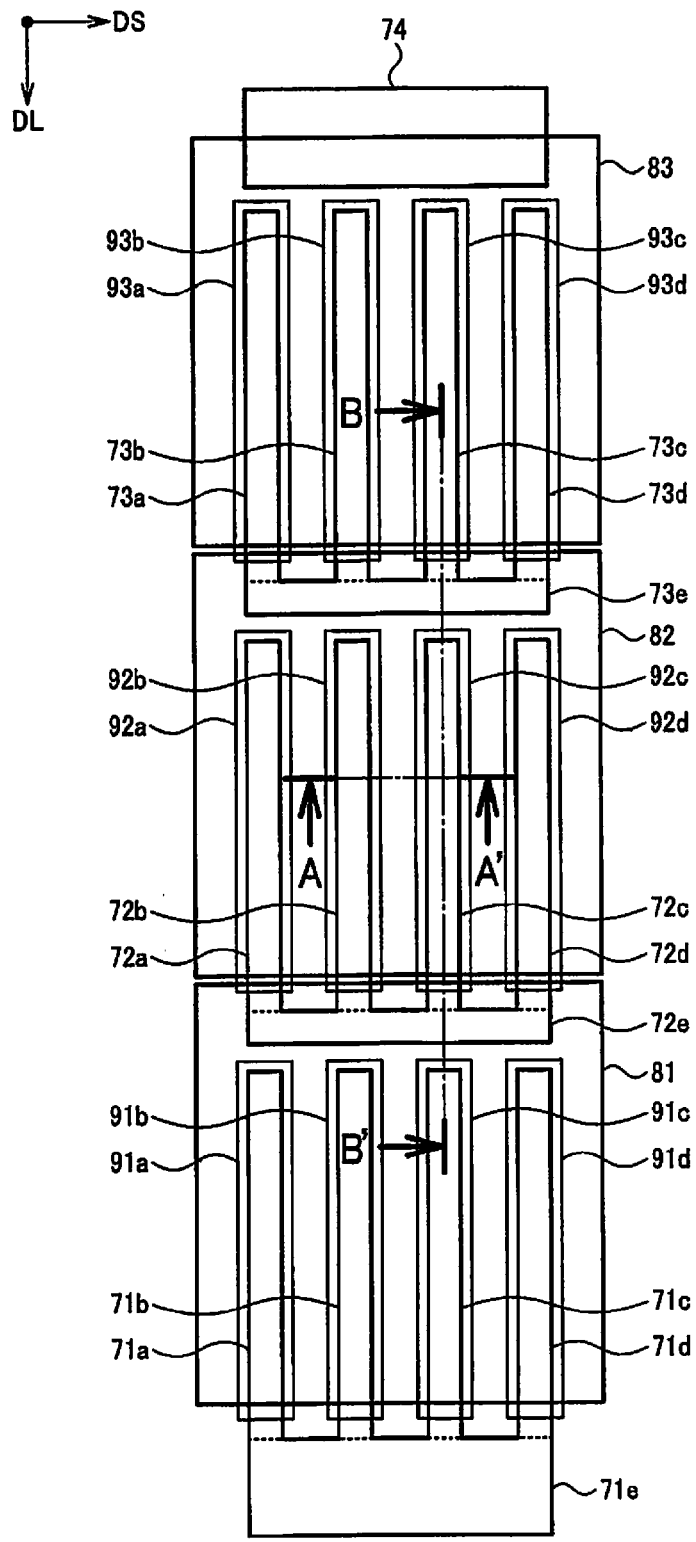
FIG. 4 is a planar diagram of a first layout configuration example of a channel element group.

FIG. 4 to FIG. 5B illustrate a first layout configuration of the channel element group CHi described above. FIG. 4 is a planar diagram viewed in the thickness direction of the substrate 60 from the ultrasound emission direction side. FIG. 5A is a cross sectional diagram of the cross section AA' in FIG. 4 and FIG. 5B is a cross sectional diagram of the cross section BB' in FIG. 4.

Firstly, the layout configuration of each of the element groups will be described with the element group EG2 as an example. The element group EG2 is configured by first electrode layers 72a to 72e, a second electrode layer 82, and piezoelectric body layers 92a to 92d.

As shown in FIG. 4, in a plan view, the first electrode layers 72a to 72d with a rectangular shape are arranged along the scanning direction DS and the long sides of the rectangular shapes are arranged so as to be along the slice direction DL. The first electrode layers 72a to 72d are connected together (in common) with the first electrode layer 72e which is arranged on the slice direction DL side of the first electrode layers 72a to 72d. The first electrode layer 72e is arranged such that the long side of the rectangular shape is along the scanning direction DS. The first electrode layers 72a to 72e are arranged above the vibrating film 50 as shown in FIG. 5A and FIG. 5B. Here, "above" refers to a direction which is separated from the substrate 60 in the ultrasonic wave emission direction in the thickness direction of the substrate 60. Here, the first electrode layers 72a to 72e are divided for convenience and are configured by one electrode layer.

The piezoelectric body layers 92a to 92d are arranged so as to cover above the first electrode layers 72a to 72d at equal intervals along the scanning direction DS. The piezoelectric body layers 92a to 92d are rectangular shapes in a plan view and the long side of the rectangular shapes is arranged so as to be along the slice direction DL. The second electrode layer 82 is arranged so as to cover above the piezoelectric body layers 92a to 92d and the first electrode layers 72a to 72d are insulated by the piezoelectric body layers 92a to 92d.

Next, the layout configuration of the element groups EG1 to EG3 will be described. The first electrode layer 71e of the element group EG1 corresponds to the signal electrode wiring LSi (or the signal terminal XAi). A second electrode layer 81 of the element group EG1 is arranged above a portion of the first electrode layers 72a to 72d and the first electrode layer 72e of the element group EG2 and the second electrode layer 81 of the element group EG1 and the first electrode layers 72a to 72e of the element group EG2 are conductive.

Then, the second electrode layer 82 of the element group EG2 is arranged above a portion of first electrode layers 73a to 73d and a first electrode layer 73e of the element group EG3 and the second electrode layer 82 of the element group EG2 and the first electrode layers 73a to 73e of the element group EG3 are conductive. A second electrode layer 83 of the element group EG3 is connected with a first electrode layer 74 which corresponds to the common electrode wiring LCi (or the common terminal XCi). The first electrode layer 74 is arranged on the opposite side in the slice direction DL when viewed from the element group EG3. In this manner, the element groups EG1 to EG3 are configured to be connected in series between the signal electrode wirings LSi and the common electrode wiring LCi.

Piezoelectric layers 91a to 93a (or 91b to 93b, 91c to 93c, and 91d to 93d) of the element groups EG1 to EG3 are arranged at equal intervals along the slice direction DL. The area of the piezoelectric body layers 91a to 93a which are interposed by the electrode layers is the same. In this case, the voltage which is applied between the electrodes which interpose the piezoelectric body layers 91a to 93a is equal, and the phase and the sound pressure of the ultrasonic waves which are emitted are also the same. By emitting the ultrasonic waves with the same phase and the same sound pressure from the elements at equal intervals in this manner, it is possible to realize an enhancement in the beam profile in the slice direction DL which will be described later in FIG. 7A to FIG. 8.

Here, in the description above, an example was described where the piezoelectric body layers (92a to 92d and the like) are rectangular shapes in a plan view and the long side of the rectangular shapes is arranged along the slice direction DL, but the present embodiment is not limited to this and, for example, the piezoelectric body layer may be a square shape (substantially square shape) or the like.

Here, the first electrode layers 71a to 71e, the first electrode layers 72a to 72e, and the first electrode layers 73a to 73e are divided for convenience (shown by dotted lines in FIG. 4 and FIG. 5B) and each is configured by one electrode layer (shown by solid lines).

Figure 6:
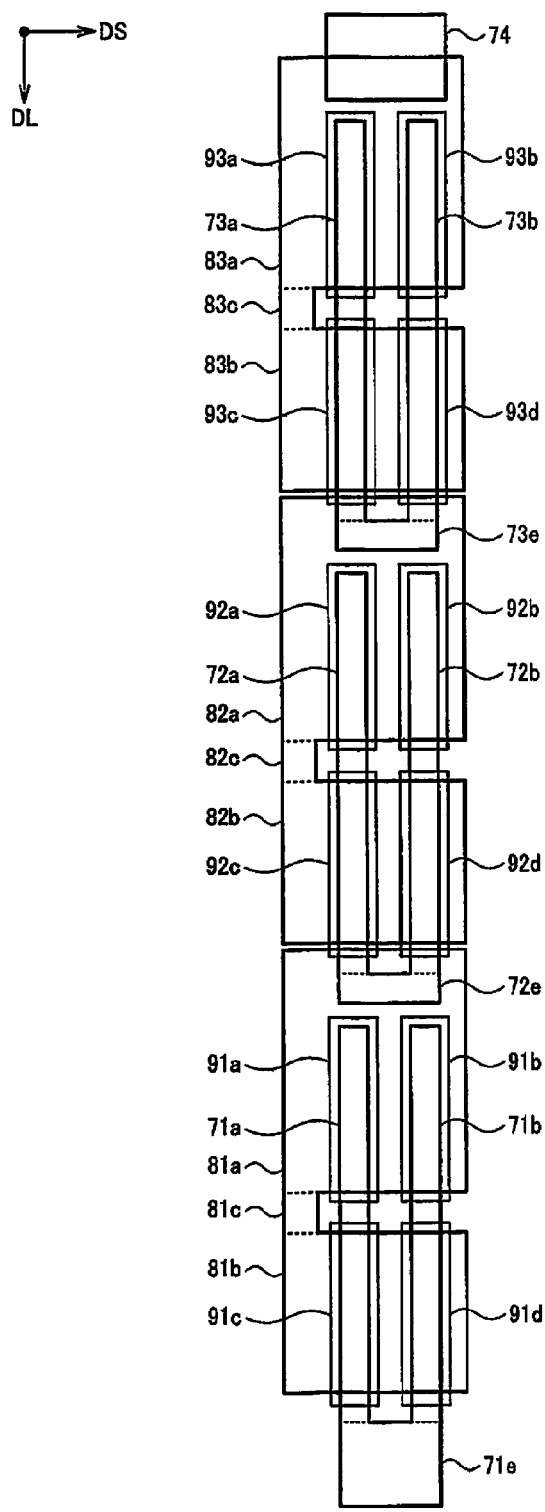
FIG. 6 is a second layout configuration example of a channel element group.

FIG. 6 illustrates a second layout modified example of the channel element group CHi. FIG. 6 is a planar diagram viewed in the thickness direction of the substrate 60 from the ultrasound emission direction side.

The layout configuration of each of the element groups will be described with the element group EG2 as an example. The element group EG2 is configured by the first electrode layers 72a, 72b, and 72e, the second electrode layers 82a to 82c, and the piezoelectric body layers 92a to 92d.

In a plan view, the first electrode layers 72a and 72b with rectangular shapes are arranged along the scanning direction DS and the long side of the rectangular shapes is arranged so as to be along the slice direction DL. The first electrode layers 72a and 72b are connected together (in common) with the first electrode layer 72e which is arranged on the slice direction DL side of the first electrode layers 72a and 72b.

The piezoelectric body layers 92a and 92c are arranged so as to cover above the first electrode layer 72a, and the piezoelectric body layers 92b and 92d are arranged so as to cover above the first electrode layer 72b. That is, the piezoelectric body layers 92a and 92b and the piezoelectric body layers 92c and 92d which are arranged at equal intervals along the scanning direction DS are configured to be arranged in two stages along the slice direction DL.

The second electrode layer 82a is arranged so as to cover above the piezoelectric body layers 92a and 92b and the second electrode layer 82b which is arranged on the slice direction DL side of the second electrode layer 82a is arranged so as to cover above the piezoelectric body layers 92c and 92d. The second electrode layers 82a and 82b are connected by the second electrode layer 82c.

Next, the layout configuration of the element groups EG1 to EG3 will be described. The second electrode layer 81a of the element group EG1 is arranged above a portion of the first electrode layers 72a and 72b and the first electrode layer 72e of the element group EG2. In addition, the second electrode layer 82 of the element group EG2 is arranged above a portion of the first electrode layers 73a and 73b and the first electrode layer 73e of the element group EG3. That is, the element groups EG1 to EG3 are connected in series between the signal electrode wiring LSi (the first electrode layer 71e) and the common electrode wiring LCi (the first electrode layer 74).

The piezoelectric body layers 91a to 93a (or 91b to 93b, 91c to 93c, and 91d to 93d) of the element groups EG1 to EG3 are arranged at equal intervals along the slice direction DL. That is, it is possible to emit ultrasonic waves with the same phase and the same sound pressure from the elements which are arranged at equal intervals in the slice direction DL even in a case where each of the element groups is configured in multiple stages as shown in FIG. 6.

Here, the first electrode layers 71a, 71b, and 71e, the first electrode layers 72a, 72b, and 72e, the first electrode layers 73a, 73b, and 73e, the second electrode layers 81a to 81c, the second electrode layers 82a to 82c, and the second electrode layers 83a to 83c are divided for convenience (shown by dotted lines in FIG. 6), and each is configured by one electrode layer (shown by solid lines).

According to the embodiment above, the ultrasonic transducer device 200 includes the ultrasonic transducer element array 100 which has $1^{st}$ to $k^{th}$ element groups (for example, EG1 to EG3 (k=3)), the first signal terminal (XAi) which is connected with a control section (for example, a processing apparatus 330 in FIG. 15) which performs at one of receiving and transmitting of signals, and the second signal terminal (XCi) which is connected with the first signal terminal (XAi) via the ultrasonic transducer element array 100. The plurality of ultrasonic transducer elements (for example, EG1 has UE11 to UE14) which are included in each of the element groups of the $1^{st}$ to $k^{th}$ element groups (EG1 to EG3) are electrically connected in parallel in each of the element groups. The $1^{st}$ to $k^{th}$ element groups (EG1 to EG3) are electrically connected in series between the first signal terminal (XAi) and the second signal terminal (XCi).

By doing so, it is possible to improve reception sensitivity since it is possible to increase the amplitude of the reception voltage by connecting the element groups EG1 to EG3 in series between the terminals XAi and XCi. In addition, by connecting the ultrasonic transducer elements in each of the element groups in parallel, it is possible to increase transmission sound pressure. In this manner, it is possible to achieve both an increase in transmission sound pressure and an improvement in reception sensitivity, and it is possible to receive slight echoes from the depths of a human body with a high S/N while suppressing the effects on the human body from the transmission ultrasonic waves.

Here, the element groups refer to the plurality of ultrasonic transducer elements which are electrically connected between two nodes. The plurality of ultrasonic transducer elements may be connected in series, may be connected in parallel, or may be connected in a combination of in series and in parallel.

For example, the second signal terminal is the common terminal XCi in the present embodiment. In this case, since the terminal at one end of the channel element group CHi is the common terminal XCi, it is easy for one of the common terminals of the plurality of channel element groups which will be described later in FIG. 11 to be shared. In a case where the common terminals are shared, for example, savings are possible in the wiring region on the substrate 60 and it is possible to reduce the numbers of the terminals and the wirings for supplying a common voltage from outside to the common terminal.

In addition, the plurality of ultrasonic transducer elements (for example, UE11 to UE14 of the element group EG1) which are electrically connected in parallel are arranged to line up in the first direction which is the scanning direction DS in the present embodiment.

In addition, the $1^{st}$ to the $k^{th}$ element groups (EG1 to EG3) are arranged to line up in the second direction which intersects with the first direction in the present embodiment. For example, the second direction is the slice direction DL in the present embodiment.

By doing so, it is possible to enhance the beam profile in the slice direction DL. This point will be described in detail with reference to FIG. 7A to FIG. 8.

Figure 7A:
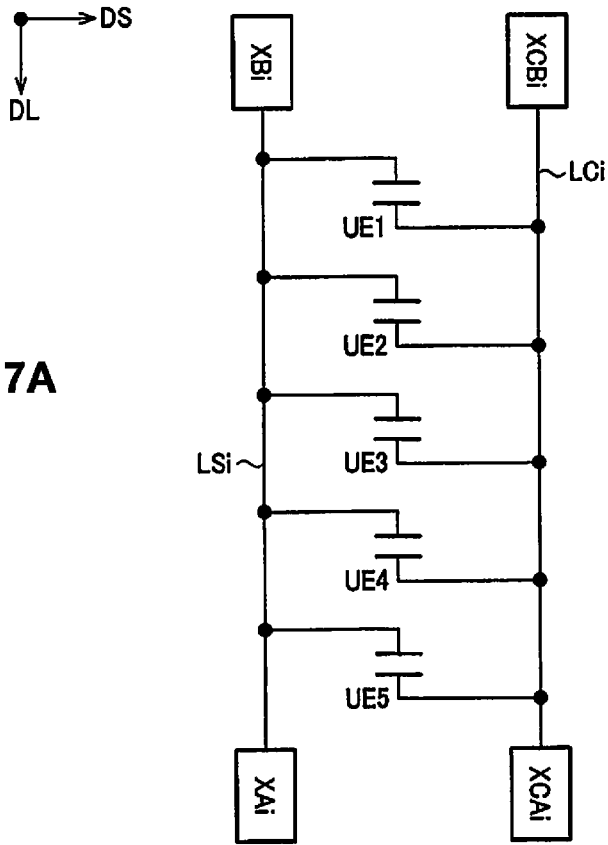
FIG. 7A is a comparative channel configuration example and FIG. 7B is sound field simulation results of the comparative configuration example.

FIG. 7A illustrates a comparative channel configuration example. In the comparative configuration example, the signal terminals XAi and XAb are connected with both ends of the signal electrode wirings LSi and common terminals XCAi and XCBi are connected with both ends of the common electrode wirings LCi. Then, ultrasonic transducer elements UE1 to UE5 are arranged along the slice direction DL and connected in parallel between the signal electrode wiring LSi and the common electrode wiring LCi. The same signal is supplied to the signal terminals XAi and XBi as the transmission signal.

In the configuration, wiring resistance in the signal electrode wiring LSi and the common electrode wiring LCi and the capacitance component which can be seen between the electrodes of the ultrasonic transducer elements UE1 to UE5 are an RC time constant circuit. The RC time constant circuit delays the phase of the transmission signal, which is applied from the signal terminals XAi and XBi, from the elements UE1 and UE5 on the outside toward the element UE3 in the center and reduces the amplitude of the transmission signal from the elements UE1 and UE5 on the outside toward the element UE3 in the center. According to the changes in the phase or the amplitude, the beam profile may change in the slice direction DL.

Figure 7B:
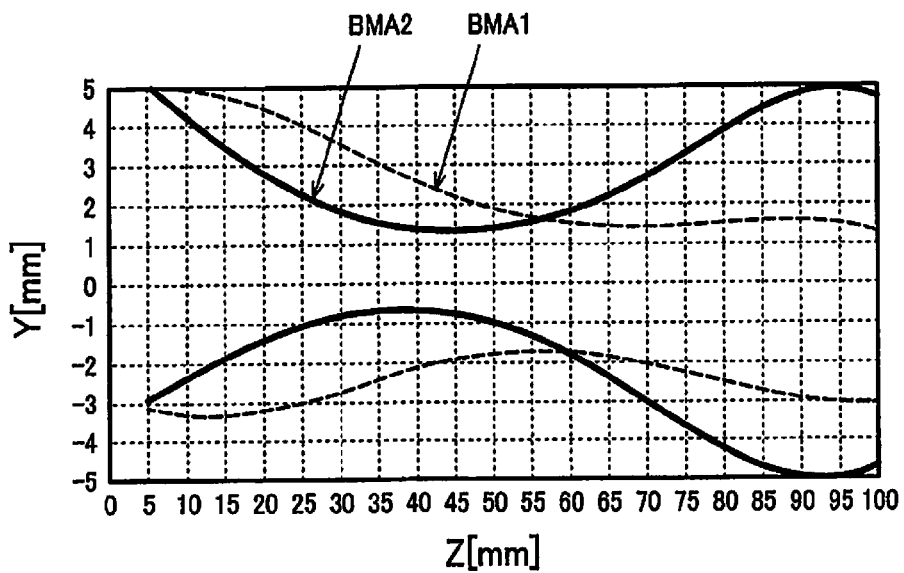

FIG. 7B illustrates sound field simulation results in a case of connecting in parallel as described above. The vertical axis Y represents the position in the slice direction DL and the horizontal axis Z represents the position in the depth direction (that is, the normal direction of the plane of the substrate 60). BMA1 which is shown by a dotted line is a sound pressure characteristic line in a case where an acoustic lens is not provided and BMA2 which is shown by a solid line is a sound pressure characteristic line in a case where an acoustic lens is provided. The sound pressure characteristic lines are lines which are drawn at Y positions from a sound pressure Y=0 to −6 dB at each of the Z positions. The width between the sound pressure characteristic lines in the direction along the Y axis represents the beam width.

Even in a case where an acoustic lens is not provided as shown by the sound pressure characteristic line BMA1, the ultrasonic beam generates a small natural focus due to the phase delay and changes in the amplitude according to the RC time constant circuit. Due to the addition of the effects of the natural focus, the beam width is significantly diffused further from the focus (approximately Z=40 mm) in the sound pressure characteristic line BMA2 in the case where the acoustic lens is provided. By doing so, the sound pressure decreases with distance and it is difficult to observe the depths or the like of the body.

In this point, according to the present embodiment, it is possible to apply transmission signals with the same phase and the same amplitude to each of the element groups by arranging the $1^{st}$ to $k^{th}$ element groups (EG1 to EG3) which are connected in series along the slice direction DL. Due to this, it is possible to suppress the natural focus as described above and realize an enhancement in the beam profile in the slice direction DL.

Figure 8:
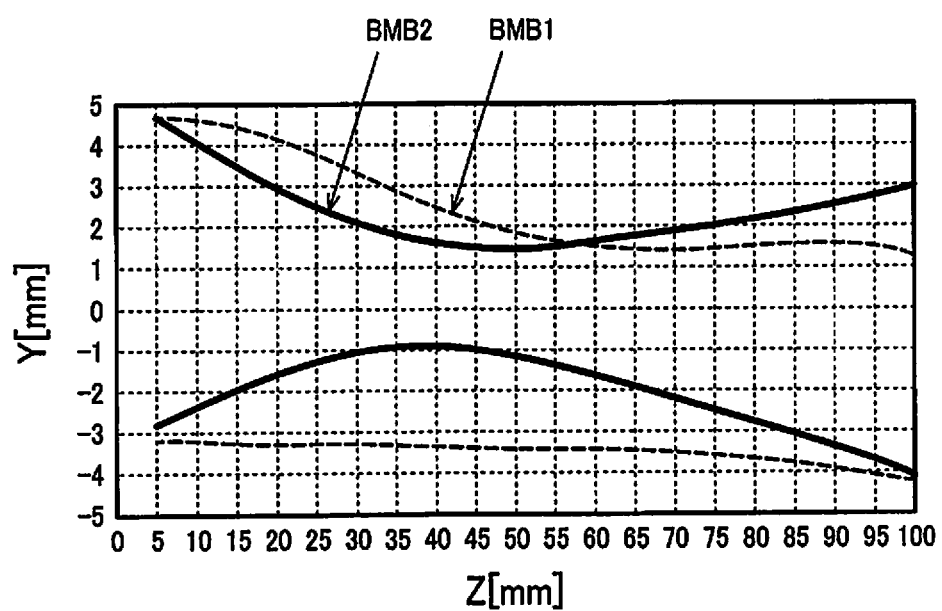
FIG. 8 is sound field simulation results of an embodiment.

FIG. 8 illustrates sound field simulation results in a case where the present embodiment is applied. The vertical axis Y represents the position in the slice direction DL and the horizontal axis Z represents the position in the depth direction (that is, the normal direction of the plane of the substrate 60). BMB1 shown by a dotted line is a sound pressure characteristic line in the case where an acoustic lens is not provided and BMB2 shown by a solid line is a sound pressure characteristic line in the case where an acoustic lens is provided. The sound pressure characteristic lines are lines which are drawn at Y positions from a sound pressure Y=0 to −6 dB at each of the Z positions. The width between the sound pressure characteristic lines in the direction along the Y axis represents the beam width.

It is understood that the sound pressure characteristic line BMB1 in a case where the acoustic lens is not provided does not converge even with distance and a natural focus is not generated. It is understood that, for the sound pressure characteristic line BMB2 in the case where the acoustic lens is provided, the beam width is reduced with distance compared to the sound pressure characteristic line BMA2 which is the comparative example. In this manner, in the present embodiment, it is possible to suppress the diffusion at a distant point compared to the comparative example and it is possible to detect the echoes even with distance. In addition, it is also possible to improve the lateral resolution in the slice direction DL since the beam width at a distant point is small.

Here, "arranged to line up in the first direction (or the second direction)" means, for example, arranged along the first direction (or the second direction). For example, in a case where a plurality of ultrasonic transducer elements are arranged to line up in the first direction (or the second direction), this is not limited to cases where the plurality of the ultrasonic transducer elements are lined up on a straight line along the first direction (or the second direction) and, for example, the plurality of the ultrasonic transducer elements may be arranged in a zigzag with respect to a straight line along the first direction (or the second direction).

Here, each of the element groups has $1^{st}$ to $j^{th}$ ultrasonic transducer elements (UE11 to UE14 in EG1, UE21 to UE24 in EG2, and UE31 to UE34 in EG3) as the plurality of ultrasonic transducer elements in the present embodiment. Out of the $1^{st}$ to $j^{th}$ ultrasonic transducer elements, each of the $s^{th}$ ultrasonic transducer elements (UE1s, UE2s, and UE3s) in the $1^{st}$ to $k^{th}$ element groups (EG1 to EG3) is arranged along the second direction (the slice direction DL).

By doing so, it is possible for the $s^{th}$ ultrasonic transducer elements (UE1s, UE2s, and UE3s) of each of the element groups to be arranged at equal intervals along the slice direction. Due to this, since it is possible to emit ultrasonic waves with the same phase and the same amplitude from the ultrasonic transducer elements (UE1s, UE2s, and UE3s) which are arranged at equal intervals, it is possible for the beam profile described above to have a more ideal profile.

In addition, in the present embodiment, as described in the layout modified example, each of the element groups has at least four of the ultrasonic transducer elements (for example, the piezoelectric body layers 93a to 93d in FIG. 6) which are arranged in a matrix in two directions of the first direction which is the scanning direction DS and the second direction (the slice direction DL) which intersects with the first direction as the plurality of ultrasonic transducer elements which are electrically connected in parallel.

Also in the layout configuration described above, it is possible to arrange the $s^{th}$ ultrasonic transducer elements (UE1s, UE2s, and UE3s) of each of the element groups at equal intervals along the slice direction DL and it is possible to enhance the beam profile.

5. Modified Example of Channel Element Group

Figure 9:
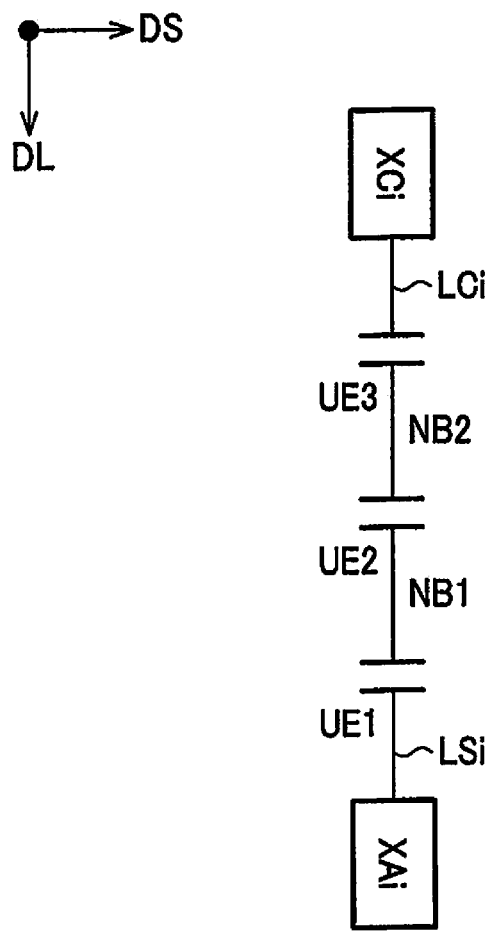
FIG. 9 is a modified example of a channel element group.

In the embodiments above, an example of a case where the element groups EG1 to EG3 are connected in series was described, but the present embodiment is not limited to this and, for example, the plurality of ultrasonic transducer elements 10 may be connected in series. FIG. 9 illustrates a modified example of the channel element group CHi in this case.

The channel element group CHi shown in FIG. 9 includes ultrasonic transducer elements UE1 to UEk (for example, k=3) which are arranged along the slice direction DL. The ultrasonic transducer elements UE1 to UE3 are connected in series between the signal electrode wiring LSi and the common electrode wiring LCi. In detail, UE1 is connected between the signal electrode wiring LSi and a node NB1, UE2 is connected between the node NB1 and a node NB2, and UE3 is connected between the node NB2 and the common electrode wiring LCi.

Figure 10:
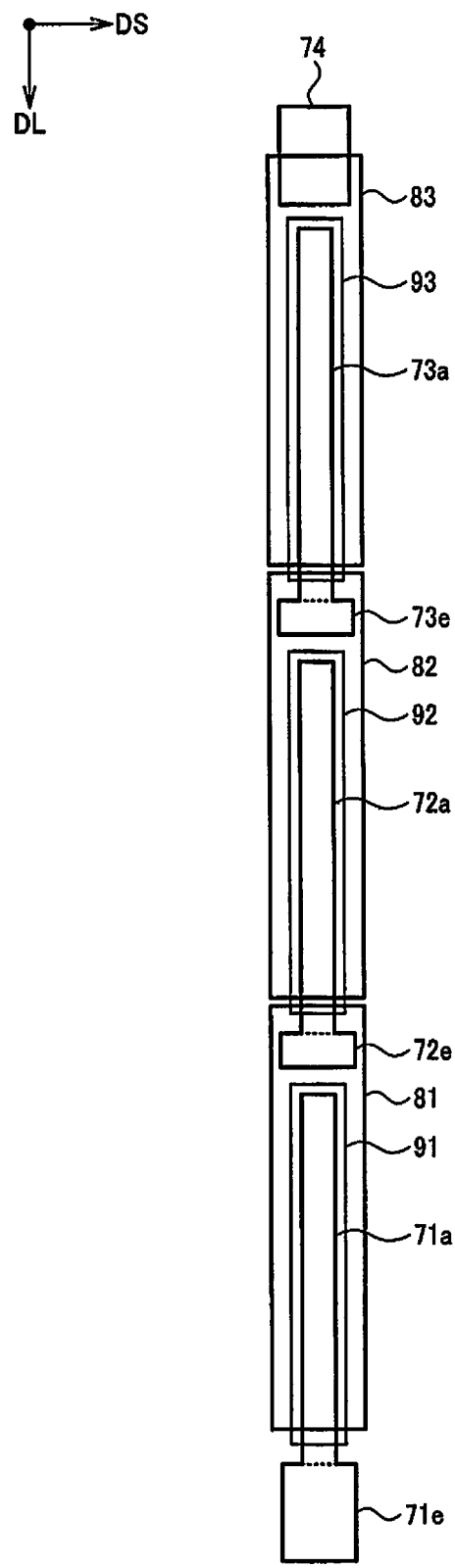
FIG. 10 is a layout configuration example which is a modified example of a channel element group.

FIG. 10 illustrates a layout configuration example of the modified example described above. FIG. 10 is a planar diagram viewed in the thickness direction of the substrate 60 from the ultrasound emission direction side. The layout configuration of the ultrasonic transducer element UE2 will be described as an example. The ultrasonic transducer element UE2 is configured by the first electrode layers 72a and 72e, the second electrode layer 82, and the piezoelectric body layer 92.

The first electrode layer 72a is a rectangular shape in a plan view and the long side of the rectangular shape is arranged so as to be along the slice direction DL. The first electrode layer 72a is connected with the first electrode layer 72e which is arranged on the slice direction DL side of the first electrode layer 72a. The piezoelectric body layer 92 is arranged so as to cover above the first electrode layer 72a. The piezoelectric body layer 92 is a rectangular shape in a plan view and the long side of the rectangular shape is arranged so as to be along the slice direction DL. The second electrode layer 82 is arranged so as to cover above the piezoelectric body layer 92.

The second electrode 81 of the ultrasonic transducer element UE1 is arranged above a portion of the first electrode layer 72a and the first electrode layer 72e, and the second electrode layer 81 of the element group EG1 and the first electrode layers 72a and 72e of the element group EG2 are conductive. In addition, the second electrode layer 82 is arranged above a portion of the first electrode layer 73a and the first electrode layer 73e of the element group EG3, and the second electrode layer 82 of the element group EG2 and the first electrode layers 73a and 73e of the element group EG3 are conductive.

Also in the modified example described above, it is possible to realize an enhancement in the shape of the beam in the slice direction DL as described in FIG. 8. That is, by arranging the plurality of ultrasonic transducer elements UE1 to UE3 which are connected in series along the slice direction DL, it is possible to apply a transmission voltage with the same phase and the same amplitude between the terminals of each of the ultrasonic transducer elements in the slice direction DL. Due to this, ultrasonic waves with the same phase and the same amplitude are emitted from each of the ultrasonic transducer elements and it is possible to get closer to the ideal shape of the beam in the slice direction DL.

Here, the first electrode layers 71a and 71e, the first electrode layers 72a and 72e, and the first electrode layers 73a and 73e are divided for convenience (shown by dotted lines in FIG. 10), and each is configured by one electrode layer (shown by solid lines).

6. Modified Example of Ultrasonic Transducer Device

Figure 11:
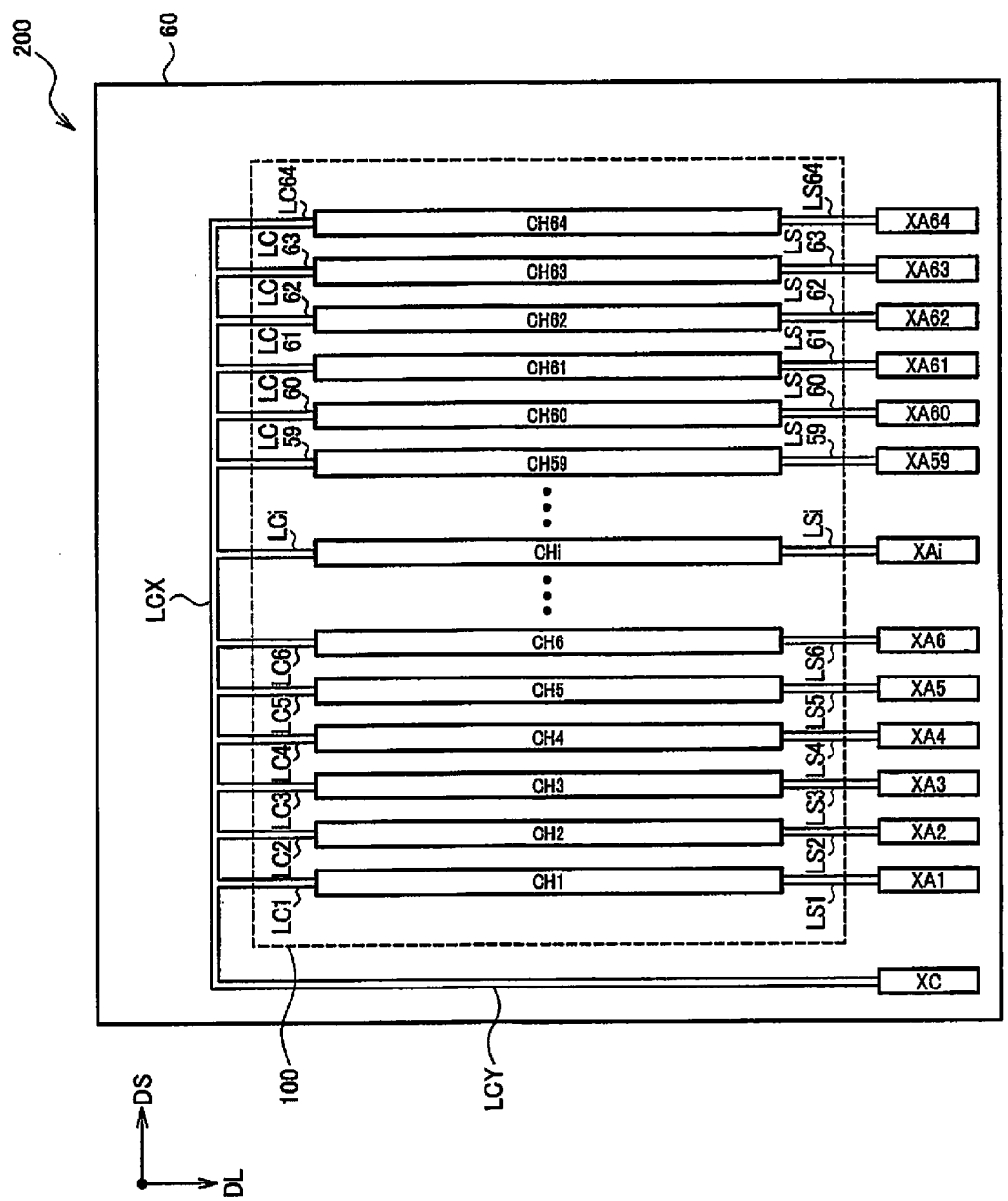
FIG. 11 is a modified example of an ultrasonic transducer device.

Here, the signal terminal XAi is connected with one end of the channel element group CHi and the common terminal XCi is connected with the other end of the channel element group CHi in the present embodiment. As a result, it is possible for the common terminals XC1 to XC64 of the channel element groups CH1 to CH64 to be easily shared by being bunched above the substrate 60. FIG. 11 illustrates a modified example of the ultrasonic transducer device 200 in a case where the common terminals are shared. Here, the constituent elements which are the same as the configuration example in FIG. 2 are given the same reference numerals and description is appropriately omitted.

The ultrasonic transducer device 200 in FIG. 11 includes the substrate 60, the ultrasonic transducer element array 100 which is formed on the substrate 60, the signal terminals XA1 to XA64 which are formed on the substrate 60, a common terminal XC (a signal terminal in a broad meaning) which is formed on the substrate 60, the signal electrode wirings LS1 to LS64 which are formed on the substrate 60, the common electrode wirings LC1 to LC64 (signal electrode wirings in a broad meaning) which are formed on the substrate 60, and a first wiring LCX and a second wiring LCY which are formed on the substrate 60.

The common terminal XC and the signal terminals XA1 to XA64 are arranged at one end section of the ultrasonic transducer element array 100 in the slice direction DL. The common terminal XC and the channel element groups CH1 to CH64 are connected by the first wiring LCX and the second wiring LCY which are arranged so as to go round from the other end section to the one end section of the ultrasonic transducer element array 100 in the slice direction DL. That is, the first wiring LCX is arranged along the scanning direction DS to the other end section of the ultrasonic transducer element array 100 in the slice direction DL. The first wiring LCX is connected together (in common) with the common electrode wirings LC1 to LC64 and connected with the common terminal XC using the second wiring LCY which is arranged along the slice direction DL.

According to the modified example described above, it is possible to arrange all of the terminals at one end section of the ultrasonic transducer device 200 by the common terminal XC being shared. Due to this, since it is possible to perform inputting and outputting of signals from only the one end section, it is possible to reduce the constituent components for inputting and outputting compared to a case where inputting and outputting of signals is performed from both end sections.

7. Head Unit

Figure 12:
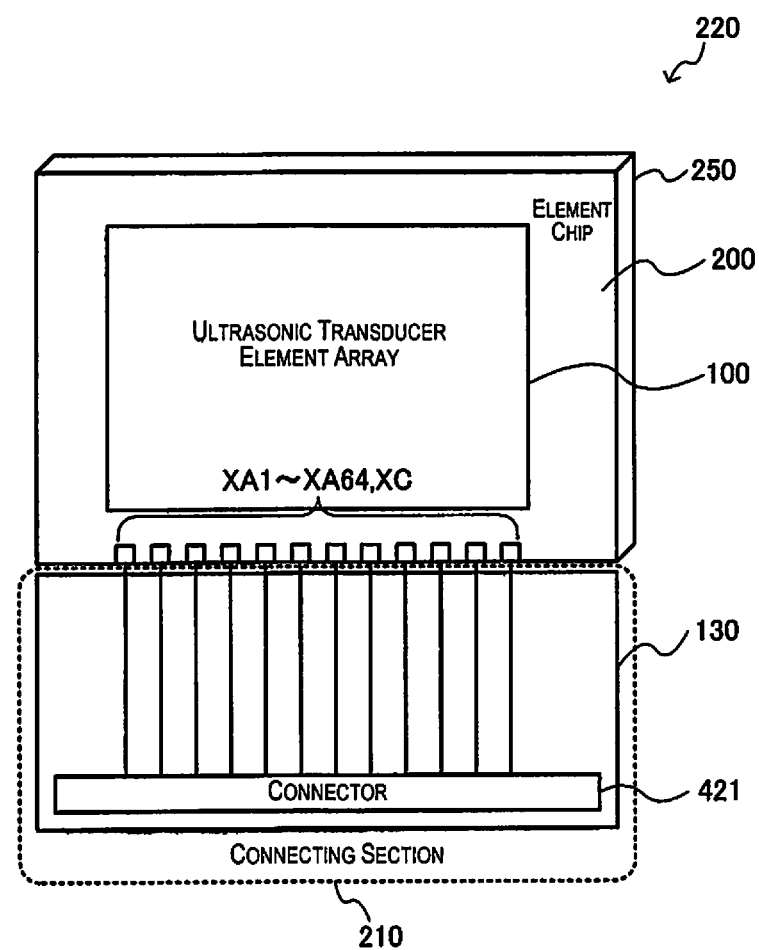
FIG. 12 is a configuration example of a head unit.

FIG. 12 illustrates a configuration example of a head unit 220 where the ultrasonic transducer device 200 of the present embodiment is mounted. The head unit 220 shown in FIG. 12 includes the ultrasonic transducer device 200 (also referred to below as an "element chip"), a connecting section 210, and a supporting member 250.

The element chip 200 includes the ultrasonic transducer element array 100, and a chip terminal group (the signal terminals XA1 to XA64 and the common terminal XC) which is provided on a first side of the element chip 200. The element chip 200 is electrically connected with a processing apparatus (for example, the processing apparatus 330 in FIG. 15) of a probe body via the connecting section 210.

The connecting section 210 electrically connects the probe body and the head unit 220 and has a connector 421 which has a terminal group (a plurality of connecting terminals), and a flexible substrate 130. A wiring group (a plurality of signal wirings and common wiring) which connects the chip terminal group and the terminal group of the connector 421 is formed on the flexible substrate 130.

As above, it is possible to electrically connect the probe body and the head unit 220 by providing the connecting section 210 and it is also possible for the head unit 220 to be attached to and detached from the probe body. In addition, it is possible to have the single connecting section 210 by providing the chip terminal group on the first side of the element chip 200. Here, in a case where the second chip terminal group (the common terminals XC1 to XC64) is provided on the second side of the element chip 200 as shown in FIG. 2, the connecting section 210 may be provided on the first side and the second side of the element chip 200.

FIG. 13A to FIG. 13C illustrate a detailed configuration example of the head unit 220. FIG. 13A illustrates a second surface SF2 side of the supporting member 250, FIG. 13B illustrates a first surface SF1 side of the supporting member 250, and FIG. 13C illustrates a side surface side of the supporting member 250.

The supporting member 250 is a member which supports the element chip 200. The connector 421 is provided on the first surface SF1 side of the supporting member 250. It is possible for the connector 421 to be attached to and detached from connectors which correspond to the probe body side. The element chip 200 is supported on the second surface SF2 side which is the rear surface of the first surface SF1 of the supporting member 250. Fixing members 260 are provided at each corner section of the supporting member 250 and are used to fix the head unit 220 to a probe casing.

Here, the first surface SF1 side of the supporting member 250 is a normal direction side of the first surface SF1 of the supporting member 250, and the second surface SF2 side of the supporting member 250 is a normal direction side of the second surface SF2 which is the rear surface of the first surface SF1 of the supporting member 250.

As shown in FIG. 13C, a protective member 270 (a protecting film) which protects the element chip 200 is provided on the surface (the surface where the piezoelectric body layer 30 is formed in FIG. 1B) of the element chip 200. The protective member 270 may also be used as an acoustic adjustment layer, an acoustic lens, or the like.

8. Ultrasonic Probe

FIG. 14A and FIG. 14B illustrate a configuration example of an ultrasonic probe 300 (a probe) where the head unit 220 described above is applied. FIG. 14A illustrates a case where a probe head 310 is mounted in a probe body 320 and FIG. 14B illustrates a case where the probe head 310 is separated from the probe body 320.

The probe head 310 includes the head unit 220 and a probe casing 240 which contains a contact member 230, which comes into contact with a subject, and the head unit 220. The element chip 200 is provided between the contact member 230 and the supporting member 250.

The probe body 320 includes the processing apparatus 330 and a probe body side connector 426. The processing apparatus 330 includes a transmission section 332, a reception section 335 (an analog front end section), and the transmission and reception control section 334. The transmission section 332 performs a process of transmitting a driving pulse (a transmission signal) to the element chip 200. The reception section 335 performs a process of receiving an ultrasonic echo signal (a reception signal) from the element chip 200. The transmission and reception control section 334 performs control of the transmission section 332 and the reception section 335. The probe body side connector 426 connects with a head unit side connector 425 (or a probe head side connector). The probe body 320 connects with an electronic device (for example, an ultrasonic imaging apparatus) body using a cable 350.

The head unit 220 is contained in the probe casing 240, but it is possible to remove the head unit 220 from the probe casing 240. By doing this, it is possible to replace only the head unit 220. Alternatively, it is possible to replace the head unit 220 in a state of being contained in the probe casing 240, that is, as the probe head 310.

9. Ultrasonic Imaging Apparatus

Figure 15:
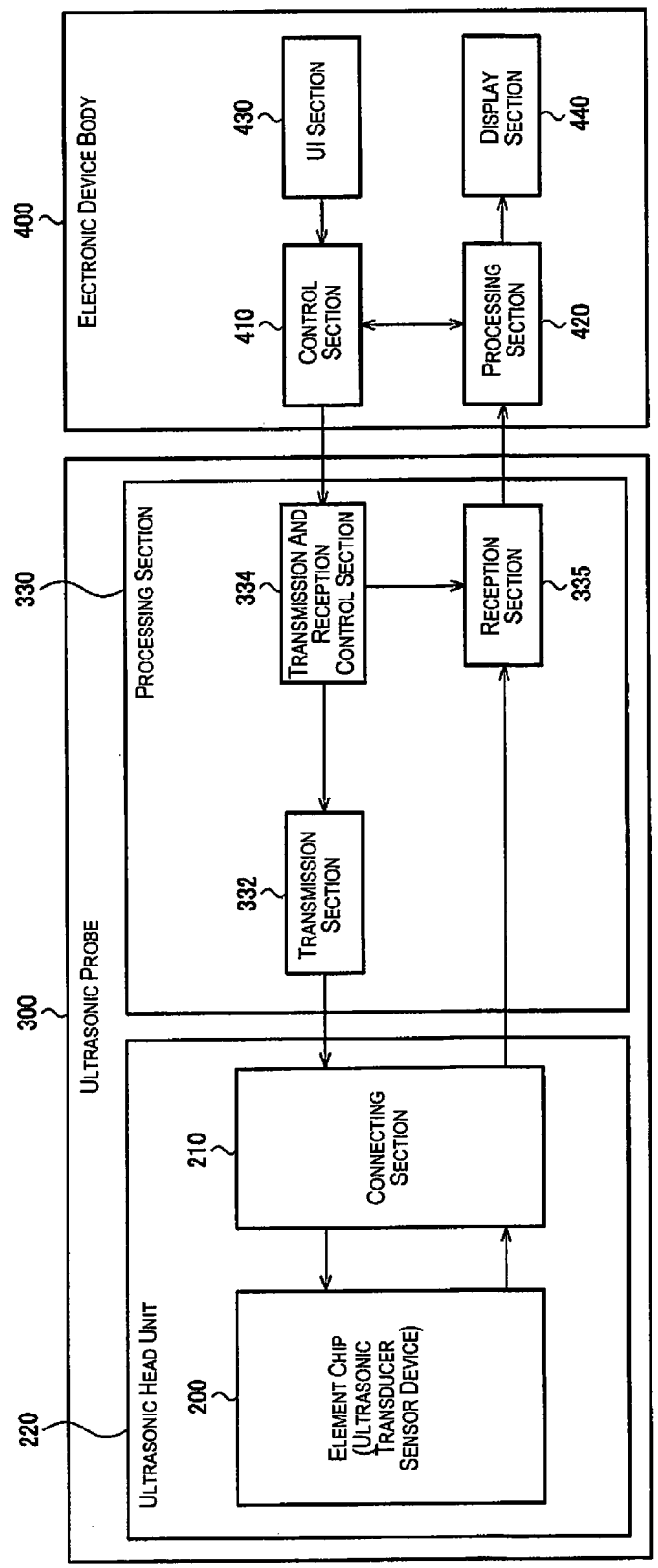
FIG. 15 is a configuration example of an ultrasonic imaging apparatus.

FIG. 15 illustrates a configuration example of an ultrasonic imaging apparatus. The ultrasonic imaging apparatus includes the ultrasonic probe 300 and an electronic device body 400. The ultrasonic probe 300 includes the head unit 220 (an ultrasonic head unit) and the processing apparatus 330. The electronic device body 400 includes a control section 410, a processing section 420, a user interface section 430, and a display section 440.

The processing apparatus 330 includes the transmission section 332, the transmission and reception control section 334, and the reception section 335 (an analog front end section). The head unit 220 includes the element chip 200 and the connecting section 210 (a connector section) which connects the element chip 200 with a circuit substrate (for example, a rigid substrate). The transmission section 332, the transmission and reception control section 334, and the reception section 335 are mounted onto the circuit substrate. The transmission section 332 may include a high voltage generating circuit (for example, a booster circuit) which generates a power supply voltage of a pulsar.

In a case where ultrasonic waves are transmitted, the transmission and reception control section 334 performs transmission instruction with respect to the transmission section 332, and the transmission section 332 receives the transmission instruction and outputs a driving voltage by amplifying a driving signal to a high voltage. In a case where reflected ultrasonic waves are received, the reception section 335 receives a reflected wave signal which is detected using the element chip 200. The reception section 335 processes the reflected wave signal (for example, an amplification process, an A/D conversion process, or the like) based on a reception instruction from the transmission and reception control section 334 and the signal after processing is transmitted to the processing section 420. The processing section 420 displays the signal on the display section 440 as an image.

Here, it is possible for the ultrasonic transducer device of the present embodiment to be applied to various electronic devices without being limited to the ultrasonic imaging apparatus for medical use as described above. For example, a diagnosis device for checking the insides of buildings and the like without damage, a user interface device which detects movement of a finger of a user using reflection of ultrasonic waves, and the like can be assumed as the electronic devices where the ultrasonic transducer device is applied.

Here, the present embodiment is described in detail as above, but it should be possible for a person skilled in the art to easily conceive that many changes are possible without substantially departing from the novel items and effects of the present invention. In accordance with this, all of the modified examples are included in the scope of the present invention. For example, in the specifications and diagrams, it is possible for terms, which are described along with different terms which have a broader or similar meaning, to be replaced at least once with the different terms in any locations in any of the specifications or diagrams. In addition, all combinations of the present embodiment and modified examples are also included in the scope of the present invention. In addition, various modifications are possible with respect to the configuration and operation of the ultrasonic transducer device, the probe, and the ultrasonic imaging apparatus, and the like without being limited to what is described in the present embodiment.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. An ultrasonic transducer device comprising:
    a substrate having a first surface and a second surface opposing to the first surface;
    first and second signal terminals disposed over the first surface of the substrate; and
    an ultrasonic transducer element array disposed over the first surface of the substrate and connected with the first and second signal terminals, the ultrasonic transducer element array having a $1^{st}$ element group to a $k^{th}$ element group, where k is a natural number such that k≥2,
    wherein each of the $1^{st}$ element group to the $k^{th}$ element group includes a plurality of ultrasonic transducer elements arranged to line up along a first direction and electrically connected in parallel, and
    the $1^{st}$ element group to the $k^{th}$ element group are arranged to line up along a second direction intersecting to the first direction and electrically connected in series between the first signal terminal and the second signal terminal,
    the first direction and the second direction are perpendicular to a normal direction of the first surface of the substrate, and
    each of the ultrasonic transducer elements has a first electrode, a second electrode, and a transducer section disposed between the first electrode and the second electrode in the normal direction of the first surface of the substrate.

2. The ultrasonic transducer device according to claim 1, wherein
    the first signal terminal is connected with a control section configured to perform receiving and transmitting of signals.

3. The ultrasonic transducer device according to claim 1, wherein the ultrasonic transducer elements electrically connected in parallel are arranged to line up along the first direction which is a scanning direction.

4. The ultrasonic transducer device according to claim 3, wherein
each of the $1^{st}$ element group to the $k^{th}$ element group has a $1^{st}$ ultrasonic transducer element to a $j^{th}$ ultrasonic transducer element, where j is a natural number such that j≥2, as the ultrasonic transducer elements, and
each $s^{th}$ ultrasonic transducer element, where s is a natural number such that s≤j, among the $1^{st}$ ultrasonic transducer element to the $j^{th}$ ultrasonic transducer element in each of the $1^{st}$ element group to the $k^{th}$ element group is arranged to line up along the second direction.

5. The ultrasonic transducer device according to claim 1, wherein
each of the $1^{st}$ element group to the $k^{th}$ element group has at least four of the ultrasonic transducer elements electrically connected in parallel and arranged in a matrix in two directions of the first direction which is a scanning direction and the second direction which intersects with the first direction.

6. The ultrasonic transducer device according to claim 3, wherein
the first electrode of each of the ultrasonic transducer elements in the $1^{st}$ element group is connected with the first signal terminal, and
the second electrode of each of the ultrasonic transducer elements in the $1^{st}$ element group is connected with the first electrode of each of the ultrasonic transducer elements in a $2^{nd}$ element group.

7. The ultrasonic transducer device according to claim 6, wherein
the second electrode of each of the ultrasonic transducer elements in a $k-1^{th}$ element group among the $1^{st}$ element group to the $k^{th}$ element group is connected with the first electrode of each of the ultrasonic transducer elements in the $k^{th}$ element group, and
the second electrode of each of the ultrasonic transducer elements in the $k^{th}$ element group is connected with the second signal terminal.

8. The ultrasonic transducer device according to claim 3, further comprising:
an additional first signal terminal, with the first signal terminal and the additional first signal terminal being arranged at a first end section of the ultrasonic transducer element array with respect to the second direction which intersects with the first direction; and
a second signal electrode wiring arranged at least at a second end section of the ultrasonic transducer element array with respect to the second direction and connected with the second signal terminal,
wherein the $1^{st}$ element group to the $k^{th}$ element group are electrically connected in series between one of the first signal terminals and the second signal electrode wiring.

9. The ultrasonic transducer device according to claim 8, wherein
the second signal terminal is arranged at the first end section, and
the second signal electrode wiring has a first wiring portion arranged at the second end section with respect to the first direction and a second wiring portion connecting the first wiring portion and the second signal terminal.

10. A head unit of a probe comprising:
the ultrasonic transducer device according to claim 1,
wherein the ultrasonic transducer device is configured and arranged to be attached and detached with respect to a probe body of the probe.

11. A probe comprising:
the ultrasonic transducer device according to claim 1; and
a probe body.

12. The probe according to claim 11, further comprising:
a flexible substrate having first signal wiring connected with the first signal terminal and a second signal wiring connected with the second terminal,
wherein the first signal terminal and the second signal terminal are arranged at one end of the ultrasonic transducer device, and
the flexible substrate is provided at the one end of the ultrasonic transducer device.

13. An ultrasonic imaging apparatus comprising:
the probe according to claim 11; and
a display section configured and arranged to display image data.

14. The ultrasonic transducer device according to claim 1, wherein
the $1^{st}$ element group to the $k^{th}$ element group are disposed on the substrate such that the $1^{st}$ element group to the $k^{th}$ element group electrically connected in series are arranged to line up along the second direction along the first surface of the substrate which is perpendicular to the normal direction of the first surface of the substrate, and
the first electrode, the transducer section and the second electrode being are accumulated in the normal direction of the first surface of the substrate.

15. An ultrasonic transducer device comprising:
a substrate having a first surface and a second surface opposing to the first surface;
first and second signal terminals disposed over the first surface of the substrate; and
an ultrasonic transducer element array disposed over the first surface of the substrate and connected with the first and second signal terminals,
wherein the ultrasonic transducer element array has one of
a plurality of ultrasonic transducer elements electrically connected in series between the first signal terminal and the second signal terminal, and
a plurality of element groups electrically connected in series between the first signal terminal and the second signal terminal, with each of the element groups having a plurality of ultrasonic transducer elements electrically connected in parallel,
the plurality of ultrasonic transducer elements or the plurality of element groups are arranged to line up along a second direction intersecting with a first direction which is a scanning direction,
the first direction and the second direction are perpendicular to a normal direction of the first surface of the substrate, and
each of the ultrasonic transducer elements has a first electrode, a second electrode, and a transducer section disposed between the first electrode and the second electrode in the normal direction of the first surface of the substrate.

16. An ultrasonic transducer device comprising:
a substrate having a first surface and a second surface opposing to the first surface;
first and second signal terminals disposed over the first surface of the substrate; and an ultrasonic transducer element array disposed over the first surface of the substrate and connected with the first and second signal terminals, the ultrasonic transducer element array having
- a first element group including a plurality of ultrasonic transducer elements arranged to line up along a first direction and electrically connected in parallel,
- a second element group including a plurality of ultrasonic transducer elements arranged to line up along the first direction and electrically connected in parallel, and
- a connecting wiring electrically connecting the first element group and the second element group in series, wherein the first element group and the second element group are arranged to line up along a second direction intersecting to the first direction, the first direction and the second direction are perpendicular to a normal direction of the first surface of the substrate, and each of the ultrasonic transducer elements has a first electrode, a second electrode, and a transducer section disposed between the first electrode and the second electrode in the normal direction of the first surface of the substrate.

* * * * *